(12) United States Patent
Benisty

(10) Patent No.: US 10,964,401 B2
(45) Date of Patent: *Mar. 30, 2021

(54) POWER SHAPING AND PEAK POWER REDUCTION BY DATA TRANSFER THROTTLING

(71) Applicant: Western Digital Technologies, Inc., San Jose, CA (US)

(72) Inventor: Shay Benisty, Beer Sheva (IL)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/452,468

(22) Filed: Jun. 25, 2019

(65) Prior Publication Data

US 2019/0311771 A1 Oct. 10, 2019

Related U.S. Application Data

(62) Division of application No. 15/838,502, filed on Dec. 12, 2017, now Pat. No. 10,366,766.

(51) Int. Cl.
| | |
|---|---|
| *G11C 16/30* | (2006.01) |
| *G06F 1/28* | (2006.01) |
| *G06F 1/3234* | (2019.01) |
| *G11C 5/14* | (2006.01) |
| *G06F 13/16* | (2006.01) |

(52) U.S. Cl.
CPC ............. *G11C 16/30* (2013.01); *G06F 1/28* (2013.01); *G06F 1/3275* (2013.01); *G06F 1/3278* (2013.01); *G06F 13/16* (2013.01); *G11C 5/14* (2013.01); *Y02D 10/00* (2018.01)

(58) Field of Classification Search
CPC .. G11C 16/30; G11C 5/14; G06F 1/28; G06F 1/3278; G06F 1/3275; G06F 13/16
USPC .................................................... 365/185.17
See application file for complete search history.

(56) References Cited

U.S. PATENT DOCUMENTS

| | | | |
|---|---|---|---|
| 8,335,123 B2 | 12/2012 | Sprouse | |
| 8,456,918 B2 * | 6/2013 | Oh | G11C 16/10 365/185.23 |
| 8,654,585 B2 * | 2/2014 | Oh | G11C 16/3454 365/185.17 |
| 8,694,719 B2 | 4/2014 | Lassa et al. | |
| 9,244,519 B1 | 1/2016 | Ellis et al. | |
| 9,280,200 B1 | 3/2016 | Glassburn et al. | |

(Continued)

OTHER PUBLICATIONS

SanDisk X110 SSD (Solid State Drive); Introducing SATA 6Gb/s high performance, reliable, and low power for an enhanced user experience; dated 2012; 2 total pages.

*Primary Examiner* — Fernando Hidalgo
(74) *Attorney, Agent, or Firm* — Patterson & Sheridan, LLP; Steven H. Versteeg

(57) ABSTRACT

An arrangement is described used to throttle data in a connected computer device having a device configured to transmit and receive data from a host, the device comprising, a device controller configured to interact with at least memory array and a data transfer throttling arrangement, the data transfer throttling arrangement configured to measure a bandwidth threshold for the device controller and pass data through the device controller when a bandwidth of the device controller is one of at and below a threshold.

20 Claims, 4 Drawing Sheets

(56) References Cited

U.S. PATENT DOCUMENTS

| | | |
|---|---|---|
| 9,367,250 B2 | 6/2016 | Tressler et al. |
| 9,658,789 B2 | 5/2017 | Erez |
| 9,671,968 B2 | 6/2017 | Kasorla et al. |
| 2012/0209946 A1* | 8/2012 | McClure ............... G06F 9/5011 709/217 |
| 2014/0237167 A1 | 8/2014 | Yurzola et al. |
| 2015/0228342 A1* | 8/2015 | Kim ....................... G11C 16/12 365/185.17 |
| 2015/0261450 A1* | 9/2015 | Tressler ................ G06F 3/0679 711/103 |
| 2018/0260015 A1* | 9/2018 | Kim ..................... H04W 28/08 |
| 2018/0260152 A1* | 9/2018 | Bar ....................... G06F 3/0625 |
| 2018/0288133 A1* | 10/2018 | Colenbrander ......... H04L 67/42 |

\* cited by examiner

POWER SHAPING AND PEAK POWER REDUCTION BY DATA TRANSFER THROTTLING

CROSS-REFERENCE TO RELATED APPLICATIONS

This application is a divisional of co-pending U.S. non-provisional patent application Ser. No. 15/838,502, filed Dec. 12, 2017. The aforementioned related patent application is herein incorporated by reference.

FIELD OF THE DISCLOSURE

Aspects of the disclosure relate to power saving technologies for devices that may be connected to a host device, such as NAND flash memory arrangement. More specifically, aspects relate to power saving and power usage shaping as well as peak power reduction by data transfer throttling for connections between host devices and connected devices.

BACKGROUND INFORMATION

Power management has become a critical issue in the computer industry. Power management is a critical parameter in solid state drives since these drives are integrated in laptop computers that consume low power in order to increase the battery life. Two important parameters are defined in devices that are used in laptop computers, namely peak power usage by a connected component and average power.

Referring to FIG. 1, a graph of power usage over time of a device connected to a laptop computer is shown. Both the device and the laptop computer are conventional devices. As can be seen in the graph of power usage over time, an average power for a device connected to a laptop computer may be 2 Watts, while the peak power may be five times that amount, 10 Watts. Durations for the power consumption may also differ as also provided in FIG. 1. Typically, the time for peak power may extend for a short interval of one (1) second, while the average power for a device connected to a laptop computer may extend for greater than six (6) seconds. Power systems, therefore must provide varying power levels at varying time limits.

During operation, conventional devices have significant challenges with power consumption. In some cases, both a low speed computer interface and high speed computer interface are used and are incorporated in the same unit to be connected to a computer. Conventional systems that use a low speed computer interface and a high speed computer interface do not adequately control the power consumption properties of an arrangement that must be connected to a computer.

There is a need to provide a memory arrangement that can be connected to a computer, such as a laptop computer, that manages power consumption requirements.

There is a further need to provide a memory arrangement that can be easily connected to a computer that also has a high speed and low speed interface.

There is a further need to provide an memory arrangement that has a high speed and low speed interface that work together to optimize the flow of data to and from a host machine, such as a computer, to a connected device, such as a memory arrangement.

There is a further need to provide a memory arrangement that interfaces with a host computer that maximizes the operation of the memory arrangement which maintaining control of power requirements. There is also a need to provide a memory arrangement that may shape the power used by the memory arrangement so that a more efficient power usage is performed.

SUMMARY

So that the manner in which the above recited features of the present disclosure can be understood in detail, a more particular description of the disclosure, briefly summarized below, may be had by reference to embodiments, some of which are illustrated in the appended drawings. It is to be noted that the appended drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In one non-limiting embodiment, a method is disclosed comprising monitoring a bandwidth of one of a write operation and a read operation from a connected device to a host, checking the bandwidth to a threshold bandwidth and sending information from the host to the connected device when the bandwidth does not exceed the threshold.

In another non-limiting embodiment, a method is disclosed comprising monitoring a bandwidth from a connected device to a host, determining when activity in the bandwidth at a memory arrangement is below a threshold, performing writing activities at a memory arrangement when a reading activity is below the threshold and delaying writing activities to be performed at the memory arrangement when the threshold is exceeded such that writing activities are performed when the threshold is not exceeded.

In another non-limiting embodiment, an arrangement is disclosed comprising a device configured to transmit and receive data from a host, the device comprising a device controller configured to interact with at least a memory array and configured to perform maintenance activities, wherein the device controller is configured to shape power usage, and a data transfer throttling arrangement, the data transfer throttling arrangement configured to measure a bandwidth threshold for the device controller and pass data through the device controller when a bandwidth of the device controller is one of at and below a threshold.

Other aspects and advantages will become apparent from the following description and the attached claims.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
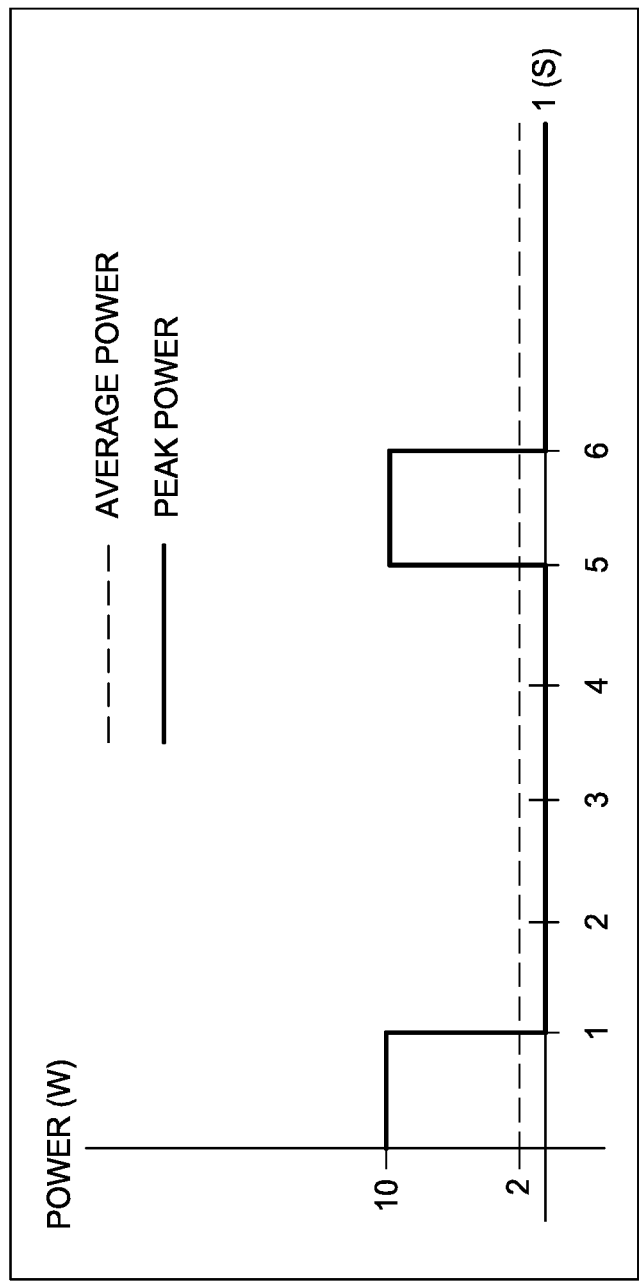
FIG. 1 is a diagram of an average power and peak power usage over time for a memory arrangement connected to a host.

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim. Likewise, reference to "the disclosure" shall not be construed as a generalization of an inventive subject matter disclosed herein and shall not be considered to be an element or limitation of the appended claims except where explicitly recited in a claim.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

The aspects of the description apply to computers and more specifically, aspects of controlling computers or computer connected devices such that the devices perform in an optimal method of operation. The aspects described relate to a host that interacts with other devices, such as a data storage arrangement. Data storage arrangements may be, for example, disk drives, hybrid disk drive, NAND flash units and other similar arrangements. In the illustrated embodiments described, NAND flash units are described.

In the embodiments described, a data storage arrangement is connected to a host system through an interface. The host system, in the illustrated embodiments is a personal computer or a server so the personal computer may transmit and receive data from a data storage arrangement. The function of the data storage arrangement is to accept and store data until the data is needed by a user or the host. The data storage arrangement may have to accept large bursts of data at a rapid pace, depending on the computer processes performed, therefore the data storage arrangement is configured with multiple memory units, formed into arrays, that provide for various states of usage. Dies may write data to the arrays, as necessary, to complete the memory storage functions.

Certain sections of the data storage arrangement may be configured of memory systems that provide for fast action (low latency) so that computer processes may be conducted at a rapid pace. Such low latency action may be accomplished by single layer cell memory configurations. If bulk amounts of data are required to be stored, multiple layer cell memory configurations are also present, such as triple level cell memory configurations. The NAND data storage arrangement with the specific arrays allow may therefore be configured from single level or multi-level cell arrangements. The data storage arrangement may have an interface that allows the data storage arrangement to connect with the host and allow for synchronization of the host and the data storage arrangement. The interface may be a SATA compatible interface, as a non-limiting embodiment. The memory storage may have a configuration to allow for plug and play ability. Although described as having a SATA compatible interface, the memory storage device may be provided with a configuration which allows for access by wireless technology. In one non-limiting embodiment, 802.11ac technology may be used to provide for fast performance for smooth streaming. Wireless technology may use, for example, between 2.5 GHz to 5 GHz frequencies for connection. In some embodiments, the storage may allow users to choose the frequencies for wireless connection.

Auxiliary connections may be provided to the data storage arrangement to allow for addition options for inputting data directly to the data storage arrangement without interfacing with a host. Such direct input of data may be provided through placement of an integrated secure digital card to offload or copy data. Other auxiliary connections may be provided for additional input/output operations. Such connections may be USB 2.0, USB 3.0, Firewire or other hard wired configurations. Gigabit Ethernet interfaces and connections may also be used. The throttling capabilities of the memory arrangement, therefore, may be used in capacities where writing of data to a NAND arrangement, secure digital card or other memory arrangement is necessary.

Internal software may be provided on the data storage arrangement to allow for efficient storage and read capability of data on the system. Such internal software may be used such that the data storage arrangement can be used as a portable media server to wirelessly stream media to a host or output device. Such output devices may include, but not be limited to, smart televisions, smart phones, stereo audio system. The internal software may also be provided such that the access of data may be performed by cloud applications designed for interface with the data storage arrangement.

The internal software of the data storage arrangement may also be configured to provide for security of the data storage arrangement. Safeguarding of material provided on the data storage arrangement prevents unauthorized access to sensitive information contained on the system. Such security may be in the form of password protection, such as a Wi-Fi password protection. In some embodiments, the data storage arrangement may be configured with software that allows the data storage arrangement to create a hardware lock. Such hardware locks may prevent access through a USB connection.

A controller is provided to control actions of the data storage arrangement as required by the host. The controller may also be configured to perform maintenance activities for the data storage arrangement to allow for efficient use. The controller may be provided with code that interfaces with the internal software of the data storage arrangement to allow the controller to perform the various functions required. The controller, for example, may interact with the dies of the data storage device to allow for reading or writing of data to the data storage device.

Figure 2:
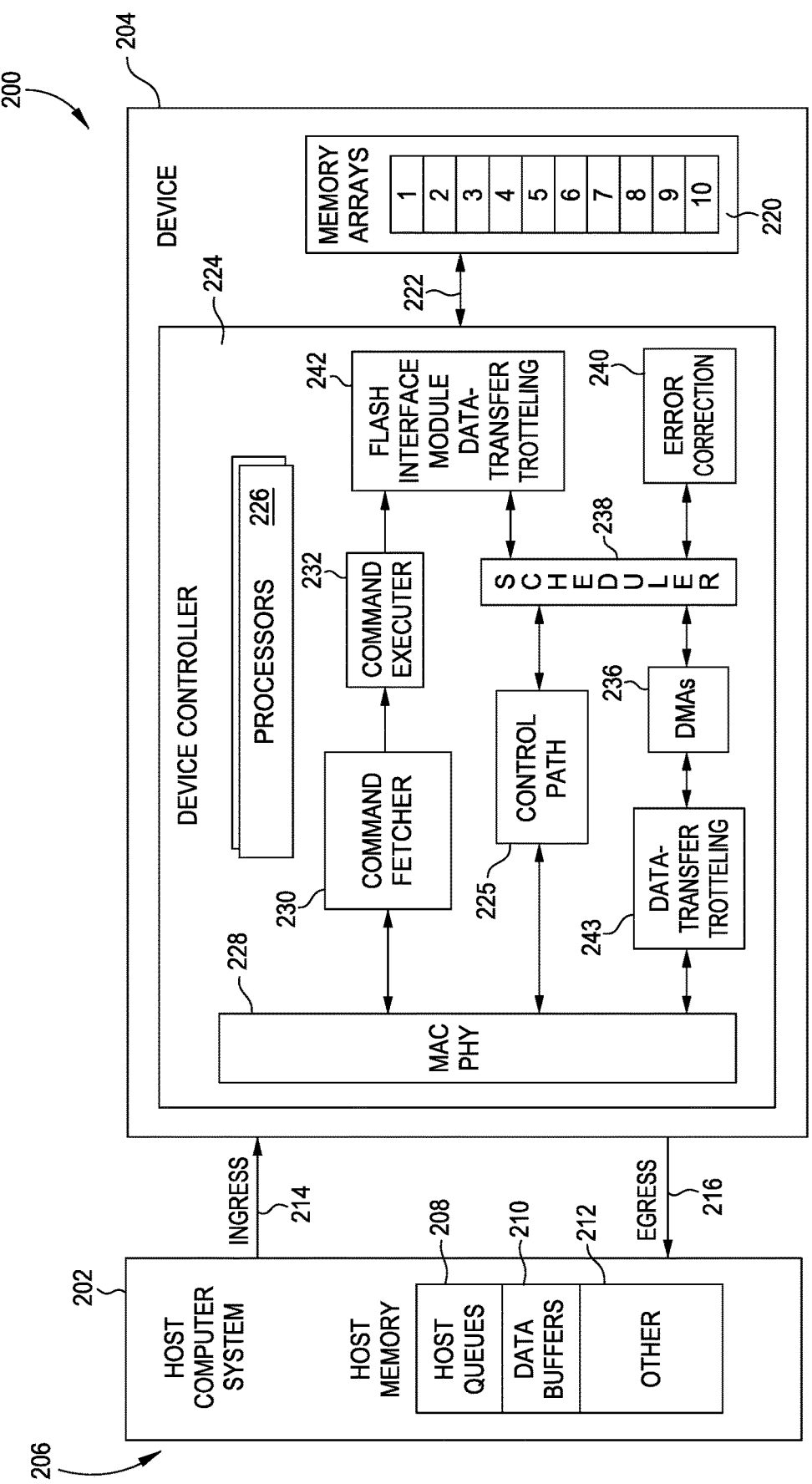
FIG. 2 is a diagram of a host and connected memory arrangement.

Referring to FIG. 2, a schematic diagram of a host computer system and a connected device controller arrangement 200 is illustrated. The arrangement 200 has a host computer system 202 that is connected to a device 204. In the illustrated example embodiment, the device 204 is a memory arrangement, such as a solid state drive. The host computer system 202 is a portable laptop computer. Other computer systems for the host computer system 202 may be used. Moreover, the device 204 may be other types of memory arrangements, such as a flash based memory arrangement. Data may be transferred to the host computer system 202 through an egress 216 connection. Data may be transferred from the host computer system 202 through an ingress 214 connection. The ingress connection 214 and the egress connection 216 may be high speed data transfer connections or low speed data transfer connections.

The host computer system 202 may have a host memory system 206 that may have host queues 208, data buffers 210 and other memory buffers 212. The queues 208, buffers 210 and other arrangements 212 may be used by the host computer system 202 to store data on a temporary basis as generated by processors (not shown) in the host computer system 202 or through interaction with the device 204.

The device 204 may have a device controller 224 that has several components to allow the device 204 to be controlled to optimize efficiency from a power usage and data transfer storage and data transfer capability. The device controller 224 may also shape the power usage of the device 204. The device controller 224 is connected to a memory array 220. The memory array 220, in the illustrated embodiment, has 10 memory arrays. The amount of memory arrays 220 may be varied and should not be considered limiting. The memory array 220 may be used to store data on a volatile or a non-volatile basis. In the illustrated embodiment, the memory array 220 stores data on a non-volatile basis in a NAND flash. The memory array 220 may group individual memory cells together in larger configurations, as needed, to store data. Each of the arrays 220 may be varied in size, therefore allowing each array the ability to adapt to the size of the data needed for storage. Such adaptation minimizes unused memory cells, thus maximizing storage capabilities for the device 204. Memory array 220 sizes may be determined by the device controller 224 and sent to the memory array 220 through a memory array connection 222.

A MAC PHY layer 228 is provided on the device controller 224. The PHY layer 228 may provide for a conversion of data between a digital form and an analogue form. In a non-limiting embodiment, data transferred in an analogue form is more suitable for long range transmission. The MAC layer 228 may receive bits from the PHY layer 228 and detect packet boundaries and assemble these bits into packets. The MAC layer may also convert data to streams of bits that may be fed into the PHY layer.

The MAC PHY layer 228 may be connected to a command fetcher 230. The command fetcher 230 may be responsible to fetching and parsing commands from the host computer system 202 and placing the commands into an internal queue. The command fetcher 230 may either send or receive information from the MAC PHY layer 228. The command fetcher 230 may also be configured to send data to a command executor 232 that execute commands, as necessary. The command executor 232 may send data to a flash interface module that uses data transfer throttling 242. The flash interface module data transfer throttling is configured to interface with memory arrays 220.

The flash interface module 242 may also send and receive data to a scheduler 228 for processing of necessary data. Necessary actions to be processed are controlled by the processors 226. The processors 226 are configured such that the processors 226 are responsible for execution of front-end and back-end tasks. The number of processors 226 provided in the device controller 224 may vary. The scheduler 238 may send and receive data to a control path 225, DMAs 236 and error correction arrangement 240. A data transfer throttling arrangement 243 is connected to send and receive information from the MAC PHY 228 and send/receive information to the DMA 236. Data may be transferred and throttled 244 between the MAC PHY 228 and the DMAs 236. The control path 225 may also be connected with the MAC PHY 228 such that data may be sent and/or received between the components. The DMA 236 is responsible, in one non-limiting embodiment, for actual data transfer between the host computer system 202 and the device 200.

Aspects of the disclosure relate to the devices 200 wherein the ingress 214 and the egress 216 may be configured as high speed and/or low speed. Several connections between the device 200 and the host computer system 202 may be present, including multiple high speed and/or low speed connections.

The flash interface module 242 is configured to be responsible for controlling and accessing the memory arrays 220. The flash interface module 242 may be configured for instances when data exchange between the device 200 and the host computer system 202 is slower than the data exchange at the memory arrays 220. In the aspects of the embodiments described, activities at the memory arrays, such as read activities, may be throttled. Other aspects of the embodiments described, use a different approach wherein data is throttled at the level of the connection between the host computer system 202 and the device 200, rather than solely at a memory array 220 level. The throttling may be achieved such that data transfer is spread over time according to a desired bandwidth of an interface between the device 200 and the host computer system 202. The throttling, at either the memory array 242 or at the arrangement 243 may take into account power usage by the device 200. To this end, longer usage (non-peak) device power may be used, such that power drawn from the host may be at non-peak levels. Additionally, in instances where the device 200 may experience a non-usage time, the scheduler may be used to plan activities during these non-usage times, shaping a power usage curve.

Figure 3:
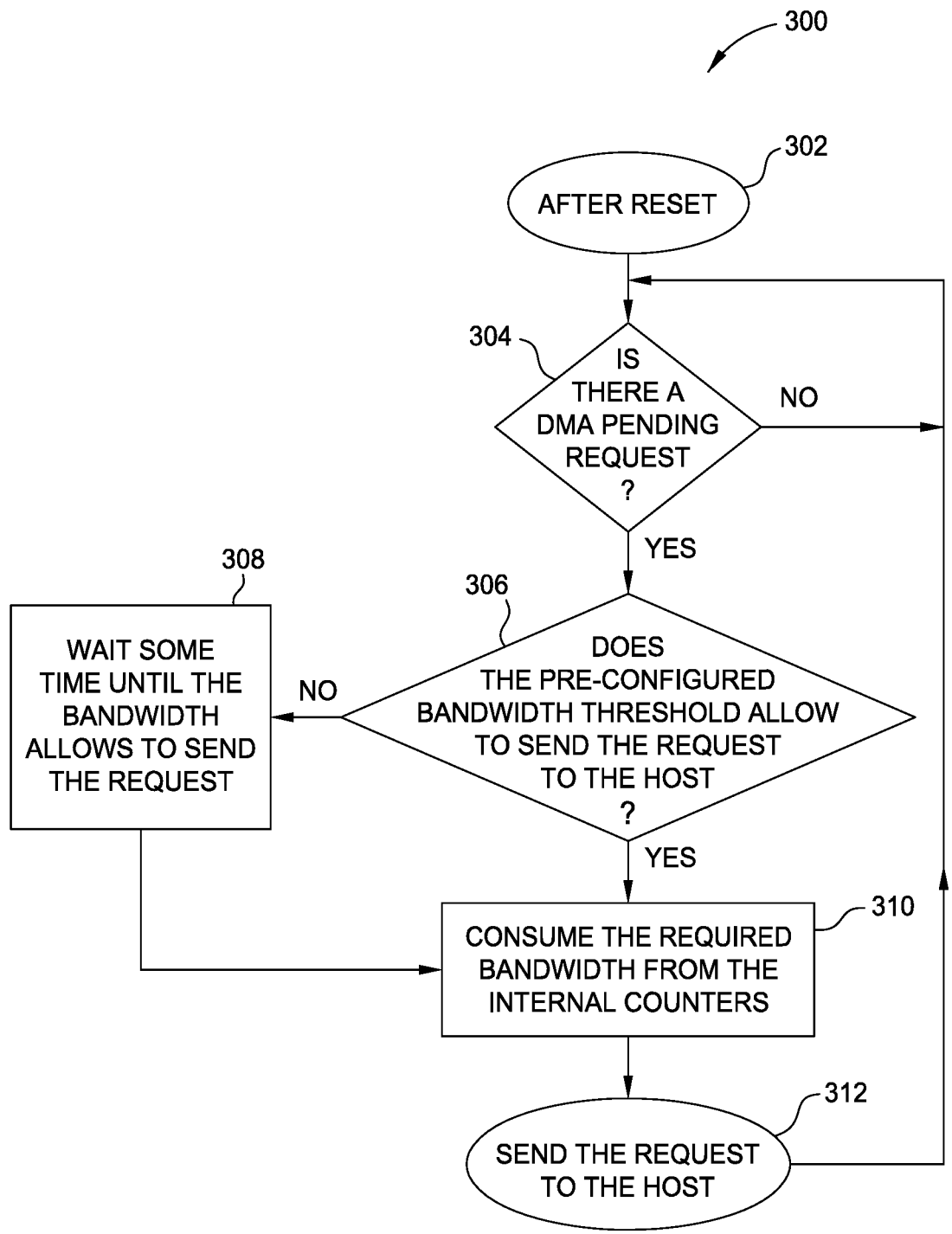
FIG. 3 is a detailed diagram of a host computer system and connected device, with device controller, in one non-limiting embodiment.

Referring to FIG. 3, a method for data-transfer throttling 300 is illustrated. A computer (host) determines if a reset has occurred. If a reset has not occurred (not in a reset state) 302, a query is run if there is a DMA pending request 304. If there is no pending DMA request, then method progresses to 312 wherein any requests are send to the host 302. If there is a DMA pending request 304, then the method progresses to 306. A query is run at 306 to determine if the pre-configured bandwidth threshold allows to send a request to the host 302. If the sending of the request to the host is not allowed according to the bandwidth threshold, then, at 308, an amount of time may be waited until the bandwidth allows the sending of the request. The amount of time may be a predescribed wait time or a continuing query may be run to check the bandwidth threshold to determine if the request may be sent. After 308, internal counters may be incremented such that the required bandwidth that is required to be consumed is accounted for at 310. At 312, the request may be sent to the host. If the pre-configured bandwidth threshold allows the request to be sent to the host, then, at 310, the internal counters may be incremented for the amount of required internal bandwidth consumed. In certain aspects, a bandwidth monitor is always active to measure the bandwidth at each point. Before issuing any host memory read/write requests, the device may check whether there is sufficient bandwidth available. When issuing a read/write request, any consumed bandwidth is decremented by an internal counter. In certain aspects, the transmit and receive bandwidths may be considered independent. To this end, limitations may be placed upon the respective transmit and receive bandwidths. For example, the receiving bandwidth may be limited to 4 GB/Sec while the transmit bandwidth may be limited to 3 GB/Sec. The method then progresses, at 312, to send the request to the host 202.

In one example embodiment, write command performance is limited by writing to the memory arrays, such as NAND and not by the host 202 to the device 204. In some example embodiments, read operations are faster than write operations. Read command execution can saturate host interfaces, such as ingress 214 and egress 216.

Figure 4:
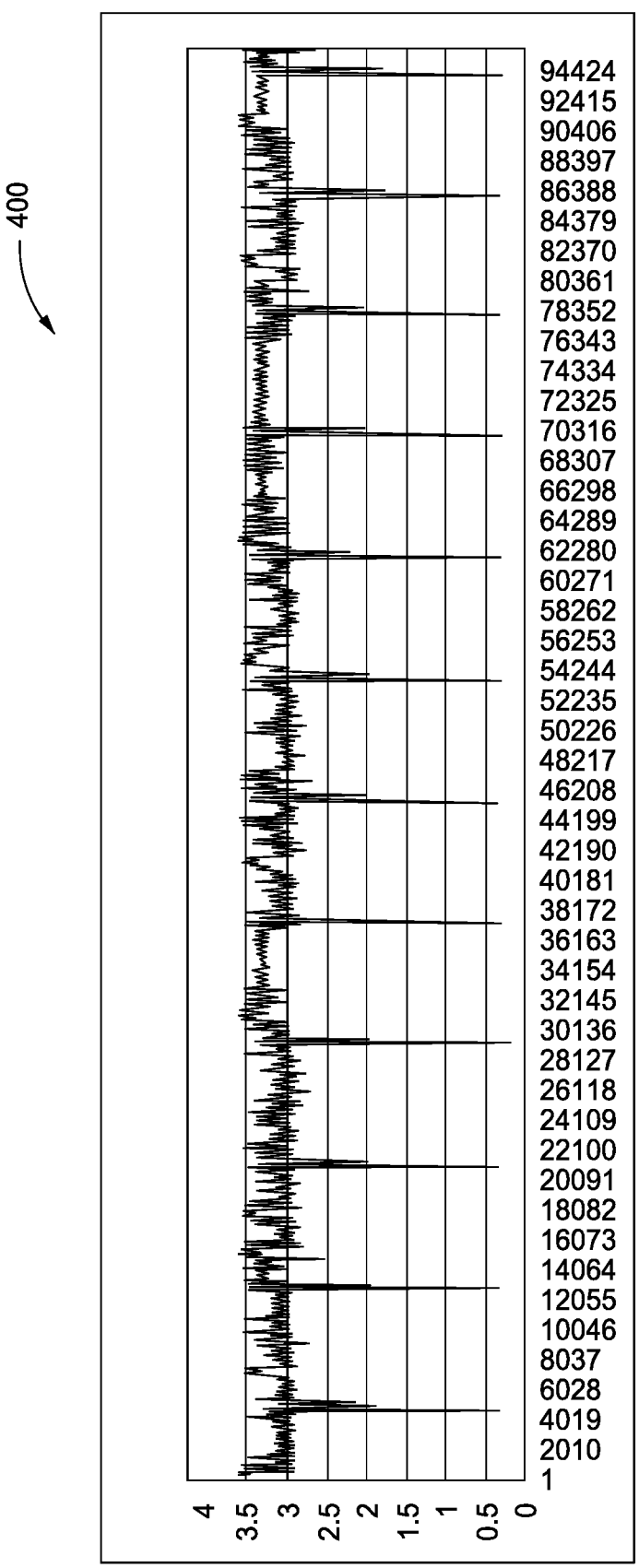
FIG. 4 is a diagram of local write performance measured on a host interface, in accordance with one example embodiment.

FIG. 4 is a graph that shows the host local write performance 400 over time while having a NAND attached to the device 204. As illustrated, the average performance is approximately 3 GB/sec but there are several points in the graph while the measured performance is almost 0. During the points in the graph when the measured performance is almost 0, the NAND is busy with erase operations and therefore the performance on the host interface is very low. As previously described, aspects of the disclosure can use the device controller scheduler to plan activities during the periods of near zero activity, therefore evening out power usage. The power usage curve may then be more nearly flat. In a like instance, during activities such as those of peak power usage, throttling of activities may occur, reducing power consumption and evening out power consumption.

Usually, write command performance is limited by the NAND and not by the host. The reason is that erase cycles are also part of the flow and this operation consumes time. Therefore, read operations are faster than write operations. Read command execution can saturate the host interface but this is not the case in write command execution. This is relevant for both sequential and random write commands.

The data-transfer throttling arrangement is responsible for shaping the performance. To accomplish this data-transfer throttling, the performance will be fixed to ~3 GB/Sec for the entire period. To case scenarios are presented.
1. CASE 1-Host interface is faster than NAND interface
In most circumstances, case 1 prevails in a majority of the activities. In this case, there are not enough NAND dies that can accept and write information to the NAND flash at a sufficient rate compared to the acceptance rate at the controller.
(Writing to memory arrays is slower than the data acquisition from the host.)
In this scenario, the performance may be shaped and the device may work at an average performance level, minimizing times of peak power consumption.
2. CASE 2-NAND is faster than Host interface
In this scenario, the device detects that the acquisition rate is less than the NAND flash rate. In these instances, data-transfer throttled at the NAND side and not in the Host side.

In one non-limiting embodiment, an arrangement is disclosed comprising a device configured to transmit and receive data from a host, the device comprising a device controller configured to interact with at least a memory array and a data transfer throttling arrangement, the data transfer throttling arrangement configured to measure a bandwidth threshold for the device controller and pass data through the device controller when a bandwidth of the device controller is one of at and below a threshold.

In another non-limiting embodiment, the arrangement may further comprise at least one interface configured to carry transmitted data from the device to the host.

In a still further embodiment, the arrangement may further comprise at least one layer in the device controller configured to convert data from a digital format to an analogue format and assemble data into packets for transmission.

In a still further embodiment, the arrangement may further comprise at least one processor configured to perform calculations for the device controller.

In another embodiment, the arrangement may further comprise a scheduler configured to schedule activities of the device controller.

In another embodiment, the arrangement may further comprise a command fetcher connected to the at least one layer wherein the command fetcher is configured to accept commands and a command executor connected to the command fetcher wherein the command executor is configured to execute commands.

In another embodiment, the arrangement may further comprise a direct memory access arrangement configured to access data from the data transfer throttling arrangement.

In another embodiment, the arrangement may further comprise a flash interface module configured to interface with at least one memory array.

In another embodiment, the arrangement may further comprise at least one memory array and a flash interface module configured to interface with the at least one memory array.

In another embodiment, the arrangement may further comprise an error correction arrangement connected to the scheduler.

In another embodiment, the arrangement may further comprise a controller path arrangement connected to the at least one layer and the scheduler.

In another non-limiting embodiment, a method is disclosed comprising monitoring a bandwidth of a write operation from a connected device to a host, determining when activity in the bandwidth exceeds a threshold and sending information from the host to the connected device when the bandwidth does not exceed the threshold.

In another non-limiting embodiment the method may further comprise waiting a predetermined time for sending the information from the host to the connected device when the bandwidth from the host to the connected device exceeds the threshold.

In another non-limiting embodiment the method may further comprise determining if a direct memory access request is pending prior to monitoring the bandwidth from the host to the connected device.

In another non-limiting embodiment the method may be performed wherein the monitoring of the bandwidth is performed only when a direct memory access request is pending.

In another non-limiting embodiment the method may further comprise prior to sending information from the connected device to the host when the bandwidth does not exceed the threshold, reducing an available bandwidth from an internal counter.

In another non-limiting embodiment the method may further comprise determining if a reset condition is present in a host prior to monitoring the bandwidth from the host to the connected device.

In another non-limiting embodiment the method may be performed wherein the progressing to the determining if the direct memory access request is pending prior to monitoring the bandwidth from the connected device to the host when a reset condition does not exist.

In another non-limiting embodiment, an arrangement is disclosed comprising means for monitoring a bandwidth from a connected device to a host, means for determining when activity in the bandwidth exceeds a threshold and means for sending information from the connected device to the host when the bandwidth does not exceed the threshold.

In another non-limiting embodiment, the arrangement may further comprise means for reducing an available bandwidth from an internal counter when the bandwidth does not exceed the threshold.

In another non-limiting embodiment a method is disclosed comprising monitoring a bandwidth from a connected device to a host, determining when activity in the bandwidth at a memory arrangement is below a threshold, performing writing activities at a memory arrangement when the reading activity is below the threshold; and delaying writing activities to be performed at the memory arrangement when the threshold is exceeded.

In another non-limiting embodiment, the method may be accomplished wherein an amount of time for the delaying the writing activities is based upon an amount of time the reading activity is above the threshold.

In another non-limiting embodiment, the method may further comprise performing the delayed writing activities when the writing activity is below the threshold.

In another non-limiting embodiment, the method may be accomplished wherein the writing activities occur on a NAND flash memory arrangement.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A device configured to transmit data to and receive data from a host, the device comprising:
   at least one memory array; and
   a device controller comprising:
      a flash interface module configured to interface with the at least one memory array;
      a physical layer interface (phy);
      a direct memory access (DMA) arrangement; and
      a data transfer throttling arrangement coupled to the DMA arrangement and configured to:
         measure a bandwidth for the phy; and
         pass a DMA request through the phy to the host in response to the bandwidth of the phy being either at or below a threshold
      wherein the data transfer throttling arrangement is coupled either:
         between the DMA arrangement and the phy; or
         within the flash interface module.

2. The device according to claim 1, wherein the device controller comprises at least one layer configured to:
   convert data from a digital format to an analogue format; and
   assemble data into packets for transmission.

3. The device according to claim 2, wherein the device controller further comprises:
   a scheduler configured to schedule activities of the device controller.

4. The device according to claim 1, wherein the device controller further comprises:
   at least one processor configured to perform calculations for the device controller.

5. The device according to claim 4, wherein the device controller further comprises:
   a command fetcher configured to accept commands; and
   a command executor connected to the command fetcher wherein the command executor is configured to execute commands.

6. The device according to claim 4, wherein the device further comprises
   an error correction arrangement.

7. The device according to claim 1, wherein the DMA arrangement is configured to access data from the data transfer throttling arrangement.

8. A device configured to transmit data to and receive data from a host, the device comprising:
   at least one memory array;
   an interface means for interacting with the at least one memory array;
   an interface means for interacting with the host;
   a direct memory access (DMA) means for handling a DMA request; and
   a data transfer throttling means for passing the DMA request through the interface means for interacting with the host responsive to the interface means for interacting with the host being at or below a bandwidth threshold,
   wherein the data transfer throttling means is coupled either:
      between the DMA means and the interface means for interacting with the host; or
      within the interface means for interacting with the at least one memory array.

9. The device of claim 8, further comprising means to:
   convert data from a digital format to an analogue format; and
   assemble data into packets for transmission.

10. The device of claim 9, further comprising means to schedule activities of a device controller.

11. The device of claim 8, further comprising means to perform calculations.

12. The device of claim 11, further comprising means to accept commands.

13. The device of claim 8, further comprising
   an error correction arrangement.

14. The device of claim 8, further comprising means to access data from the data transfer throttling means.

15. A method of operating a data storage device having a direct memory access (DMA) arrangement to store data in one or more memory arrays, the method comprising:
   determining that there is a pending DMA request;
   measuring a bandwidth for a physical layer interface (phy) with a data transfer throttling arrangement in response to the pending DMA request; and
   passing data a DMA request through the phy in response to the bandwidth of the phy being either at or below a threshold, wherein the data transfer throttling arrangement is coupled either:
      between a DMA arrangement and the phy; or
      within a flash interface module.

16. The method of claim 15, further comprising:
   converting data from a digital format to an analogue format; and
   assembling data into packets for transmission.

17. The method of claim 16, further comprising scheduling commands for the device controller.

18. The device according to claim 1, wherein the data transfer throttling arrangement is configured to delay the DMA request to the phy in response to the bandwidth of the phy exceeding the threshold.

19. The device according to claim 8, wherein the data transfer throttling means is configured to delay the DMA request to the interface means for interacting with the host in response to the bandwidth of the interface means for interacting with the host exceeding the threshold.

20. The method according to claim 15, further comprising delaying the DMA request to the phy in response to the bandwidth of the phy exceeding the threshold.

* * * * *